(12) United States Patent
Marz

(10) Patent No.: US 6,173,017 B1
(45) Date of Patent: Jan. 9, 2001

(54) TRANSIT MODULATOR FOR JITTERING SIGNALS

(75) Inventor: Freimut Marz, Oberschleissheim (DE)

(73) Assignee: Tektronix, Inc., Beaverton, OR (US)

( * ) Notice: Under 35 U.S.C. 154(b), the term of this patent shall be extended for 0 days.

(21) Appl. No.: 08/978,849

(22) Filed: Nov. 26, 1997

(30) Foreign Application Priority Data

Nov. 29, 1996 (DE) ............................................. 196 50 839

(51) Int. Cl.[7] ...................................................... H04L 27/04

(52) U.S. Cl. ............................................ 375/295; 375/272

(58) Field of Search .............................. 341/131; 375/371, 375/295, 296, 372, 354

(56) References Cited

U.S. PATENT DOCUMENTS

| | | | | |
|---|---|---|---|---|
| 5,245,341 | * | 9/1993 | Maeder | 341/131 |
| 5,252,973 | * | 10/1993 | Masuda | 341/131 |
| 5,311,180 | * | 5/1994 | Borgen | 341/131 |

OTHER PUBLICATIONS

Robert C. Dixon, Spread Spectrum Systems with Commercial Applications, 1994, John Wiley & Sons, p. 436.*
Marvin E. Frerking, Digital Processing in Communication Systems, 1994, Kluwer Academic Publishers, pp. 95, 96, 326, 342, and 346.*

* cited by examiner

Primary Examiner—Don N. Vo
(74) Attorney, Agent, or Firm—Thomas F. Lenihan; Francis I. Gray

(57) ABSTRACT

The invention relates to a transit modulator for jittering a signal ($U_{in}$) comprising a memory (3), a clock generator (2) connected to said memory (3) and generating a jitter free input clock (T) as well as a further clock generator (5) connected to said memory (3) and generating a jittered output clock ($T_j$).

It is the object of the invention to provide a transit modulator which allows any kind of signals and thus also non-binary digital signals to be jittered.

This object is accomplished according to the invention by a transit modulator in which an A/D converter (1) is pre-connected and a D/A converter (4) is post-connected to said memory (3).

2 Claims, 1 Drawing Sheet

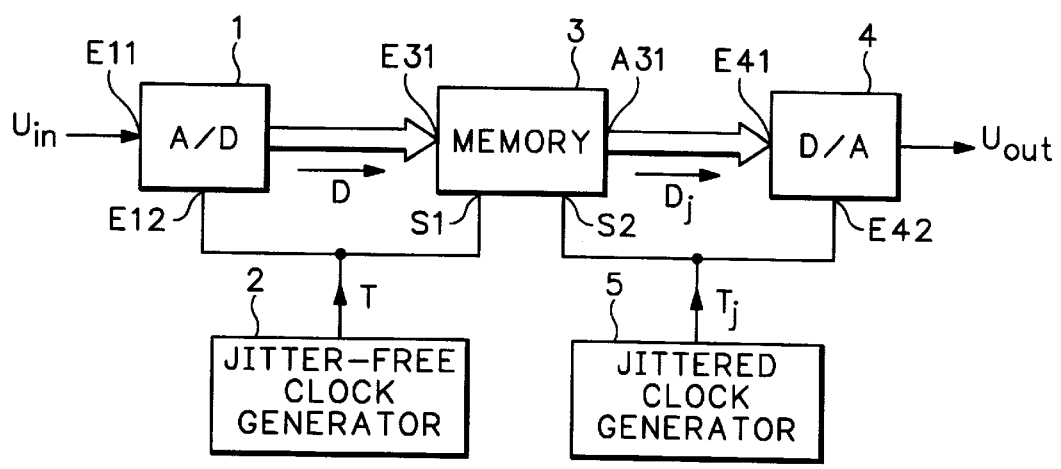

TRANSIT MODULATOR FOR JITTERING SIGNALS

FIELD OF THE INVENTION

The invention relates to a transit modulator for jittering (adding jitter to) a signal, said modulator comprising a memory, a clock generator connected to said memory and generating a jitter free input clock as well as a further clock generator connected to said memory and generating a jittered output clock.

BACKGROUND OF THE INVENTION

A transit modulator of this type is for example disclosed in the service manual for the K4312 SDH/PDH analyser of Siemens AG (pages 5–5 and 9–36). In this prior art transit modulator, a memory as well as associated electronic components for storage and output is integrated in an ASIC (application specific IC) module. Using the prior art transit modulator, binary digital signals may be jittered.

SUMMARY OF THE INVENTION

It is the object of the invention to provide a transit modulator which can be used to jitter any kind of signal.

This object is accomplished by a transit modulator according to the invention in which an A/D converter is pre-connected and a D/A converter is post-connected to said memory.

The advantage of the transit modulator according to the invention is that the presence of the A/D and D/A converters also allows the jittering of non-binary digital signals such as 2B1Q or 4B3T signals as well as analog signals.

The above-mentioned reference also discloses a method for jittering a signal in which binary values characterizing said signal are stored in a memory using a jitter free input clock and subsequently read out using a jittered output clock, and a jittered signal is generated from the binary output values.

For jittering any kind of signals, the invention suggests a method in which the signal is sampled to give samples, the binary values characterizing said signal are obtained from said samples by A/D conversion and the jittered signal is generated by D/A conversion of the binary values read out.

The advantage of the method according to the invention is that the A/D and D/A conversions allow the jittering not only of binary digital signals, but also of non-binary digital signals such as 2B1Q or 4B3T signals as well as analog signals.

BRIEF DESCRIPTION OF THE DRAWING

The sole FIGURE shows one embodiment of a transmit modulator for jittering a signal in accordance with the invention.

DETAILED DESCRIPTION OF THE INVENTION

The FIGURE shows an A/D converter 1 having an input E11 as well as a further input E12 to which a clock generator 2 is pre-connected. The output of the A/D converter 1 is connected to an input E31 of a memory 3. Said memory may for example be a FIFO (first in first out) store. Post-connected to an output A31 of said memory 3 is a D/A converter 4 with an input E41. A further input E42 of the D/A converter 4 is connected to a further clock generator 5. The memory 3 has two control inputs S1 and S2, said first control input S1 being connected to the one clock generator 2 and said second control input S2 being connected to the other clock generator 5. One output of the D/A converter 4 forms the output of the transit modulator according to the invention.

A signal $U_{in}$ is input to the A/D converter 1 where it is sampled using a jitter free clock T preset by the clock generator 2 and subjected to A/D conversion to form binary values. Such binary values form a binary data flow D which is transmitted in parallel to the memory 3. In said memory 3, the binary values of the binary data flow D are stored using the clock T preset by the clock generator 2.

Subsequently, the binary values are read out from the memory 3 using a further jittered clock $T_j$ preset by the clock generator 5 to form a jittered data flow $D_j$. In doing so, the order in which the binary values were stored in said memory 3 is maintained during read-out, i.e. binary values which were stored first are also read out first.

The clock $T_j$ provided by the further clock generator 5 is of the same frequency as the clock T from the clock generator 2 but jittered with respect thereto so that during read-out of the binary values from the memory 3 the jittered data flow $D_j$ is obtained. The latter is transmitted in parallel to the D/A converter 4 to which the jittered clock $T_j$ is applied. In said D/A converter 4 a signal $U_{out}$ is formed by D/A conversion of the jittered data flow $D_j$, i.e. D/A conversion of the binary values contained therein, said signal $U_{out}$ being jittered with respect to signal $U_{in}$.

The binary data flow D is transmitted in parallel between the A/D converter 1 and the memory 3, i.e. all the binary values which were generated at a specific sampling time are transmitted to the memory 3 simultaneously. The same is true correspondingly for the transmission of the binary read-out values between the memory 3 and the D/A converter 4. If the transmission of the binary values between the A/D converter 1 and the memory 3 and between the memory 3 and the D/A converter 4, respectively, is to be of a serial kind instead, the clock used for sampling in the A/D converter 1 and the clock used for storing the binary values in the memory 3 as well as the jittered clock used for reading out the binary values from said memory 3 and the jittered clock in the D/A converter 4 need to be matched to each other correspondingly.

The arrangement according to the invention allows both binary digital signals and non-binary digital signals such as 2B1Q or 4B3T signals as well as analog signals to be jittered.

What is claimed is:

1. A transmit modulator for producing a jittered representation of an input signal ($U_{in}$), comprising:
    a memory (3);
    a clock generator (2) connected to said memory (3) and generating a jitter free input clock signal (T); and
    a further clock generator (5) connected to said memory (3) and generating a jittered output clock signal ($T_j$);
    wherein an A/D converter (1) is pre-connected and a D/A converter (4) is post-connected to said memory (3); and
    wherein said A/D converter receives said jitter-free input clock signal and said D/A converter receives said jittered output clock signal;
    said D/A converter producing a jittered representation of said input signal.

2. A method for jittering a signal ($U_{in}$) comprising the steps of:

storing in a memory (3) binary values characterizing the signal ($U_{in}$) using a jitter free input clock (T) and subsequently reading out said binary values using a jittered output clock ($T_j$);

generating a jittered signal ($U_{out}$) from said binary values read out; wherein sampling said signal ($U_{in}$) to form samples, obtaining the binary values characterizing said signal ($U_{in}$) from the samples by A/D conversion, and obtaining the jittered signal ($U_{out}$) by D/A conversion of the binary values read out.

\* \* \* \* \*